US007206982B1

(12) United States Patent
Patel et al.

(10) Patent No.: US 7,206,982 B1
(45) Date of Patent: Apr. 17, 2007

(54) DIAGNOSTIC MECHANISM FOR AN INTEGRATED CIRCUIT

(75) Inventors: Dipesh Ishwerbhai Patel, Saffron Walden (GB); David Walter Flynn, Cambridge (GB); Michael Peter Muller, Cambridge (GB)

(73) Assignee: ARM Limited, Cambridge (GB)

( * ) Notice: Subject to any disclaimer, the term of this patent is extended or adjusted under 35 U.S.C. 154(b) by 239 days.

(21) Appl. No.: 10/868,342

(22) Filed: Jun. 16, 2004

(51) Int. Cl.
*G01R 31/28* (2006.01)

(52) U.S. Cl. .................. 714/724; 714/30; 714/733; 375/224

(58) Field of Classification Search ............... None
See application file for complete search history.

(56) References Cited

U.S. PATENT DOCUMENTS

| | | | |
|---|---|---|---|
| 5,764,655 A * | 6/1998 | Kirihata et al. | 714/733 |
| 6,331,782 B1 * | 12/2001 | White et al. | 324/763 |
| 6,412,086 B1 * | 6/2002 | Friedman et al. | 714/733 |
| 6,759,863 B2 * | 7/2004 | Moore | 324/765 |
| 6,865,503 B2 * | 3/2005 | Harper et al. | 702/122 |
| 6,895,532 B2 * | 5/2005 | Raynham | 714/46 |
| 2002/0137501 A1 * | 9/2002 | Datar et al. | 455/419 |
| 2003/0212941 A1 | 11/2003 | Gillies et al. | |
| 2004/0025097 A1 * | 2/2004 | Lou | 714/726 |
| 2005/0110778 A1 | 5/2005 | Ayed | |
| 2005/0138499 A1 * | 6/2005 | Pileggi et al. | 714/724 |
| 2005/0193294 A1 * | 9/2005 | Hildebrant | 714/723 |
| 2005/0193295 A1 * | 9/2005 | Fenech Saint Genieys | 714/724 |
| 2005/0260963 A1 * | 11/2005 | Ponce De Leon et al. | 455/226.3 |

* cited by examiner

Primary Examiner—Albert Decady
Assistant Examiner—John P. Trimmings
(74) Attorney, Agent, or Firm—Nixon & Vanderhye P.C.

(57) ABSTRACT

A diagnostic mechanism for an integrated circuit 2 uses a radio interface circuit 16 to provide communication between an external diagnostic device 22 and one or more diagnostic circuits 26, 28 within the integrated circuit 2. The use of a radio communication link for diagnostic data and control reduces the required pin count for the integrated circuit 2.

22 Claims, 5 Drawing Sheets

DIAGNOSTIC MECHANISM FOR AN INTEGRATED CIRCUIT

BACKGROUND OF THE INVENTION

1. Field of the Invention

This invention relates to the field of integrated circuits. More particularly, this invention relates to a mechanism for use during diagnostic operations performed upon integrated circuits, such as, for example, debug, trace and manufacturing test.

2. Description of the Prior Art

With the increase in complexity of integrated circuits there is an increasing need for thorough and efficient diagnostic mechanisms. These diagnostic mechanisms may be used to identify design or programming errors through techniques such as debugging and tracing. Further diagnostic techniques may be used to identify whether a particular integrated circuit has been manufactured correctly as part of manufacturing test operations. In order to provide communication with these on-chip diagnostic mechanisms, it is known to provide dedicated or dual purpose integrated circuit pins which can be used to insert data to, remove data from, control and otherwise interact with the diagnostic mechanisms concerned. Depending upon the bandwidth required for this communication, it may be necessary to provide a large number of such pins to enable appropriate communication.

As the complexity of integrated circuits has increased there has also been a trend to requiring an increased pin count on integrated circuit packages. This is a difficult technical challenge and the pin count available is often a design constraint for integrated circuits. Furthermore, each pin on an integrated circuit also has to have an appropriate connection in the external system to which it can be attached and the provision of such connections as well as the need to make the attachment tends to increase manufacturing costs. These manufacturing cost issues can be particularly severe within applications such as micro-controllers where it is important that the devices and their associated larger systems should be as inexpensive as practical. A requirement for increased pin count may also result in a need to step up from one integrated circuit package size with a given available pin count to a larger, more expensive integrated circuit package size so as to increase the available pin count to meet the total requirements including appropriate diagnostic connections.

SUMMARY OF THE INVENTION

Viewed from one aspect the present invention provides an integrated circuit comprising:

at least one data processing circuit operable to perform data processing operations;

a diagnostic circuit operable to perform one or more diagnostic operations upon said at least one data processing circuit; and a radio circuit operable to provide communication between said diagnostic circuit and an external diagnostic device.

The invention recognizes that contrary to expectation it is practical and cost effective in many situations to provide an on-chip radio circuit to provide diagnostic communication rather than to provide physical pins, even when these are shared, to enable connection to an external diagnostic device. The balance in cost and convenience surprisingly favours the provision of on-chip radio circuits and appropriate controlling mechanisms which might typically comprise many hundreds or thousands of integrated circuit elements over the provision of a seemingly simple physical circuit pin connections.

It will be appreciated that the communication provided between the diagnostic circuit and the external diagnostic device, such as an appropriately programmed general purpose computer with a radio transceiver, could take a variety of different forms and be used to provide either data communication, control communication or both in either direction. However, the preferred communication made via the radio circuit is recovering result data from the integrated circuit to the external diagnostic device and transferring control data from the external diagnostic device to the on-chip diagnostic circuit.

As previously mentioned, the diagnostic operations being performed could take a variety of different forms and preferably include one or more of debugging, tracing and manufacturing test operations.

It is possible that the radio circuit could be an autonomous circuit block capable on its own of providing a communication link with the external diagnostic device. However, in preferred embodiments one or more of the data processing circuits which are being subject to the diagnostic operations can themselves be used in combination with the radio circuit to provide the communication link. This reuse of some of the non-diagnostic data processing circuits reduces the effective overhead of providing the radio link. As an example, a processor core operating under program instruction control during non-diagnostic operation can be reused during diagnostic operation to provide functions such as managing the communication stack and error correction operations in conjunction with the radio circuit to provide the communication link.

The radio circuit could be provided upon the integrated circuit for the dedicated purpose of communication with the diagnostic mechanisms that are on-chip. However, the present technique is particularly well suited to systems which have a radio circuit on-chip which is used for operational non-diagnostic purposes since this can be reused for the link with the diagnostic circuits and effectively reduce the overhead of this technique.

A particularly convenient way of providing such a link is within circuits having a Bluetooth on-chip radio circuit which may be provided with a diagnostic profile in addition to their operational profiles via which communication may be made with the on-chip diagnostic circuit as required.

Viewed from another aspect the present invention provides a method of performing diagnostic operations upon an integrated circuit, said method comprising the steps of:

performing one or more diagnostic operations with a diagnostic circuit upon one or more data processing circuits of said integrated circuit; and communicating between said diagnostic circuit and an external diagnostic device with a radio circuit.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
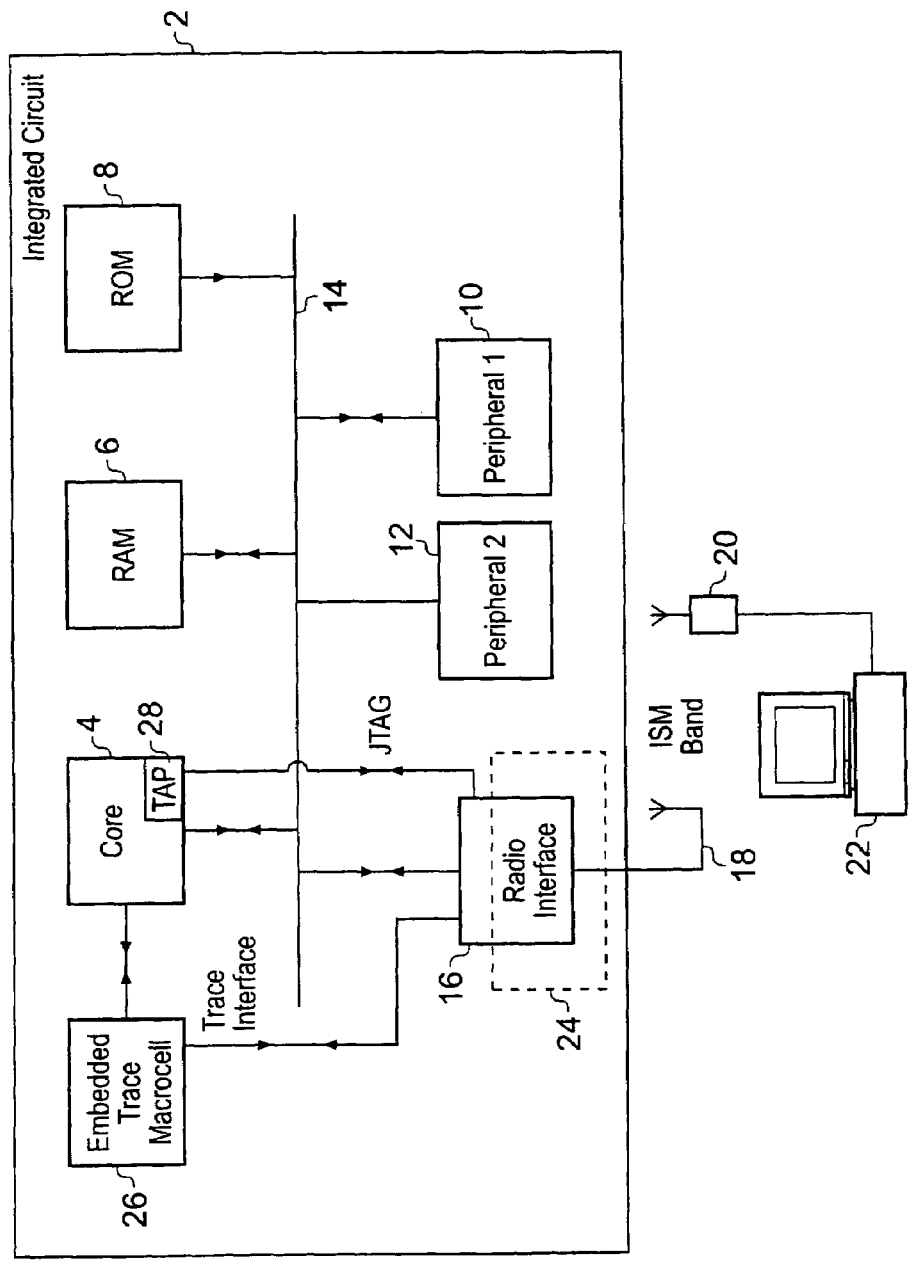
FIG. 1 schematically illustrates a first example integrated circuit having an on-chip radio circuit for diagnostic communication.

FIG. 1 illustrates an integrated circuit 2 including a processor core 4, a random access memory 6, a read only memory 8, a first peripheral 10 and a second peripheral 12 all connected to a common system bus 14. It will be appreciated that this type of integrated circuit 2 may typically contain many other different types of circuit element connected in a variety of different ways. As an example, the integrated circuit may be a dedicated DSP integrated circuit which is not flexibly programmable in the sense of a processor core, or may take other forms as will be apparent to those skilled in this technical area.

A radio interface circuit 16 is also coupled to the system bus 14 and is provided with an antenna 18. The antenna 18 may be provided via a dedicated antenna pin of the integrated circuit 2 or alternatively may be an antenna embedded within the integrated circuit packaging itself, such as an appropriate sized conductor line at the periphery of the integrated circuit package. The antenna 18 communicates via a radio signal within the ISM band with a radio transceiver 20 associated with an external diagnostic device 22 in the form of a general purpose computer running appropriate diagnostic software. The radio interface circuit 16 will incorporate both analog type circuitry and digital type circuitry. The division 24 illustrated by the dotted line in FIG. 1 illustrates an analog circuit area within which the analog circuitry of the radio interface circuit 16 is confined. This analog circuit area 24 will be bounded by appropriate physical features and electrical interfaces so as to reduce the effect of radio interference from analogue high frequency portion the radio interface circuit 16 into the digital circuits of the integrated circuit 2 as a whole.

The radio interface circuit 16 exchanges diagnostic data and diagnostic control signals with the external diagnostic device 22 and passes these to both an embedded trace macrocell 26 and a debug test access port 28 of the processor core 4 as directed by the external diagnostic device 22. The embedded trace macrocell 26 may be used to trace real time operation of the integrated circuit 2 and the radio interface circuit 16, if it has sufficient bandwidth, may transmit real time trace data from the integrated circuit 2 to the external diagnostic device 22. The debug test access port 28 within the processor core 4 may be accessed via the radio interface circuit 16 and used to control the processor core 4 to execute program instructions specified by the external diagnostic device 22 so as to test the core itself, the operational programs and the other circuit elements within the integrated circuit 2 in accordance with normal debug techniques.

Figure 2:
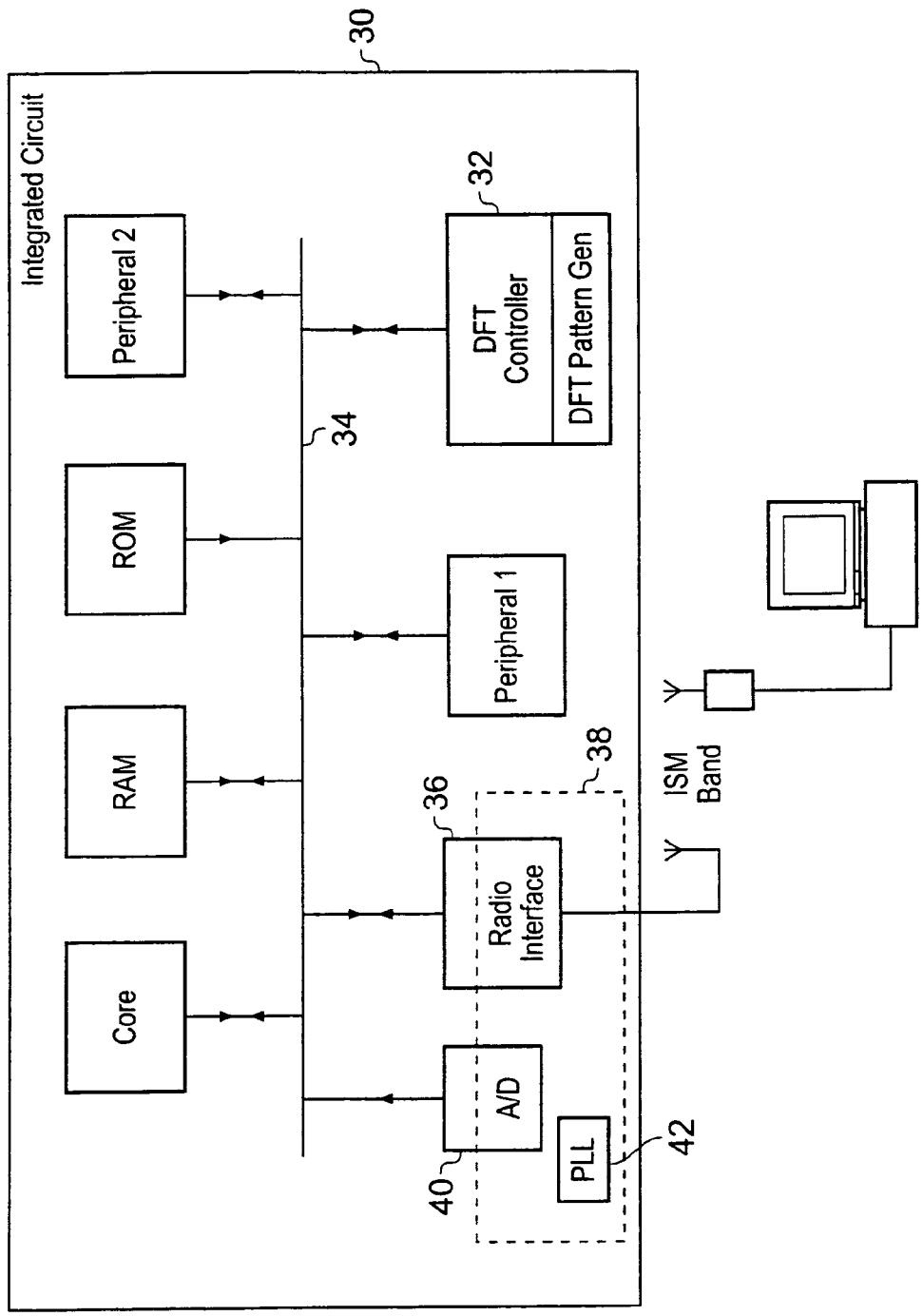
FIG. 2 schematically illustrates a second example integrated circuit having an on-chip radio circuit for diagnostic communication.

FIG. 2 illustrates a second example integrated circuit 30, which in this case includes a manufacturing test circuit 32 which serves to perform manufacturing tests upon the integrated circuit 30. Such manufacturing tests use test patterns generated on-chip by a pattern generator to stimulate the elements within the integrated circuit 30 in a predetermined fashion with the results of those stimulations being captured and compared with expected results. If the actual results match the expected results, then the individual integrated circuit 30 has performed correctly and will be passed as correctly manufactured. The manufacturing test circuit 32 is in this example connected to the system bus 34 as is the radio interface circuit 36. Bus transactions can thus be used between the manufacturing test circuit 32 and the radio interface circuit 36 to communicate control signals to and from the manufacturing test circuit 32 as well as result or stimulation data to and from the manufacturing test circuit 32.

The analog circuit portion 38 illustrated within the example of FIG. 2 also includes an analog to digital converter circuit 40 and a phase locked loop circuit 42 as are typically found within many integrated circuit designs. It will be appreciated that it is common within integrated circuit designs to provide analog circuit areas which can also be used to conveniently house the analog circuit elements of the radio interface circuit 36 without unduly increasing cost or complexity.

Figure 3:
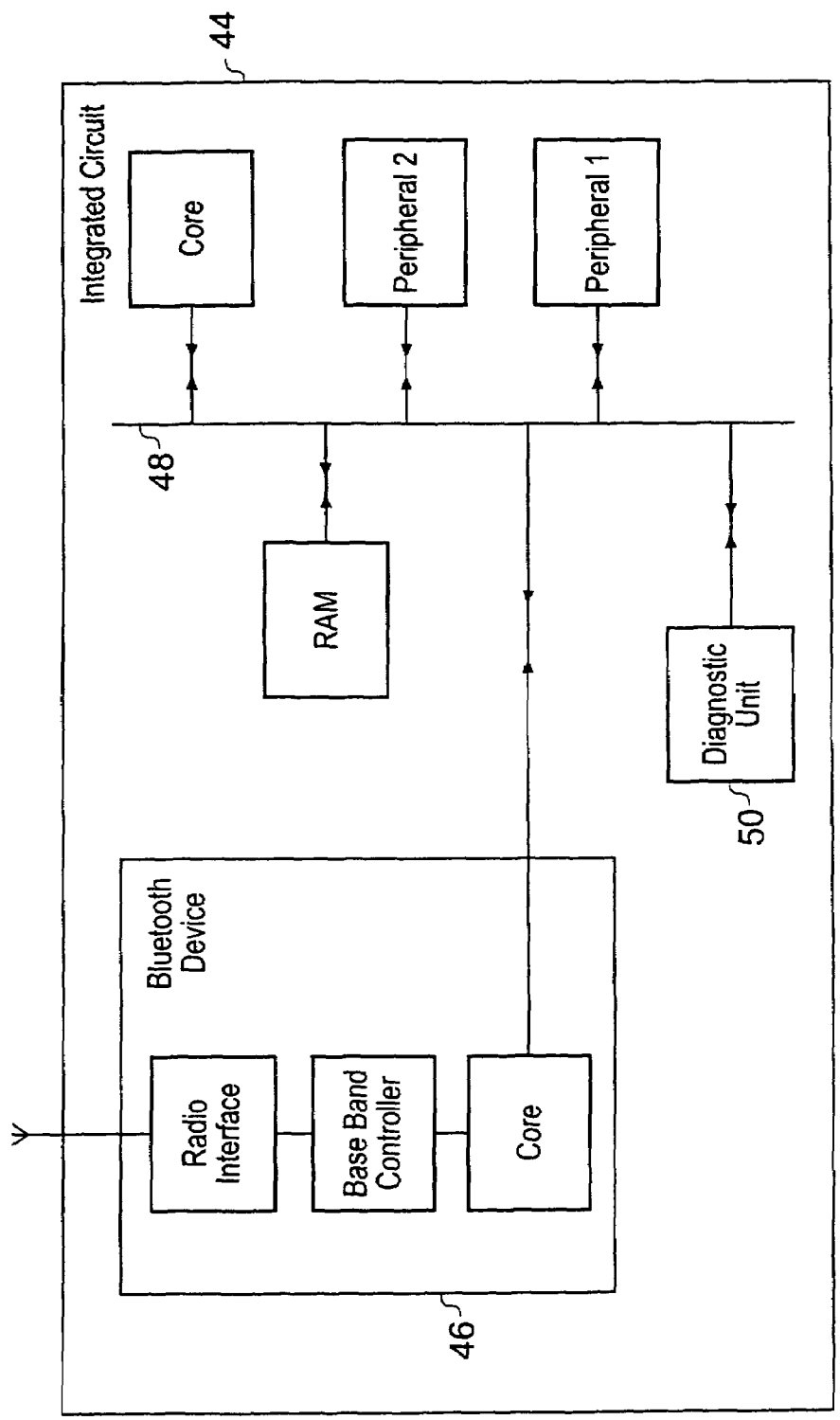
FIG. 3 schematically illustrates a third example integrated circuit having an on-chip radio circuit for diagnostic communication.

FIG. 3 illustrates a third example integrated circuit 44. In this example an on-chip Bluetooth radio circuit 46 is connected to the system bus 48 and is used during non-diagnostic operations to provide a normal Bluetooth radio communication capability to the integrated circuit 44. This Bluetooth radio circuit 46 can be reused during diagnostic operations to provide communication with a diagnostic circuit 50 which performs a variety of different diagnostic functions. Reuse of the operational Bluetooth radio interface circuit 46 reduces the additional cost and complexity associated with providing a radio diagnostic communication link to and from the diagnostic circuit 50.

Figure 4:
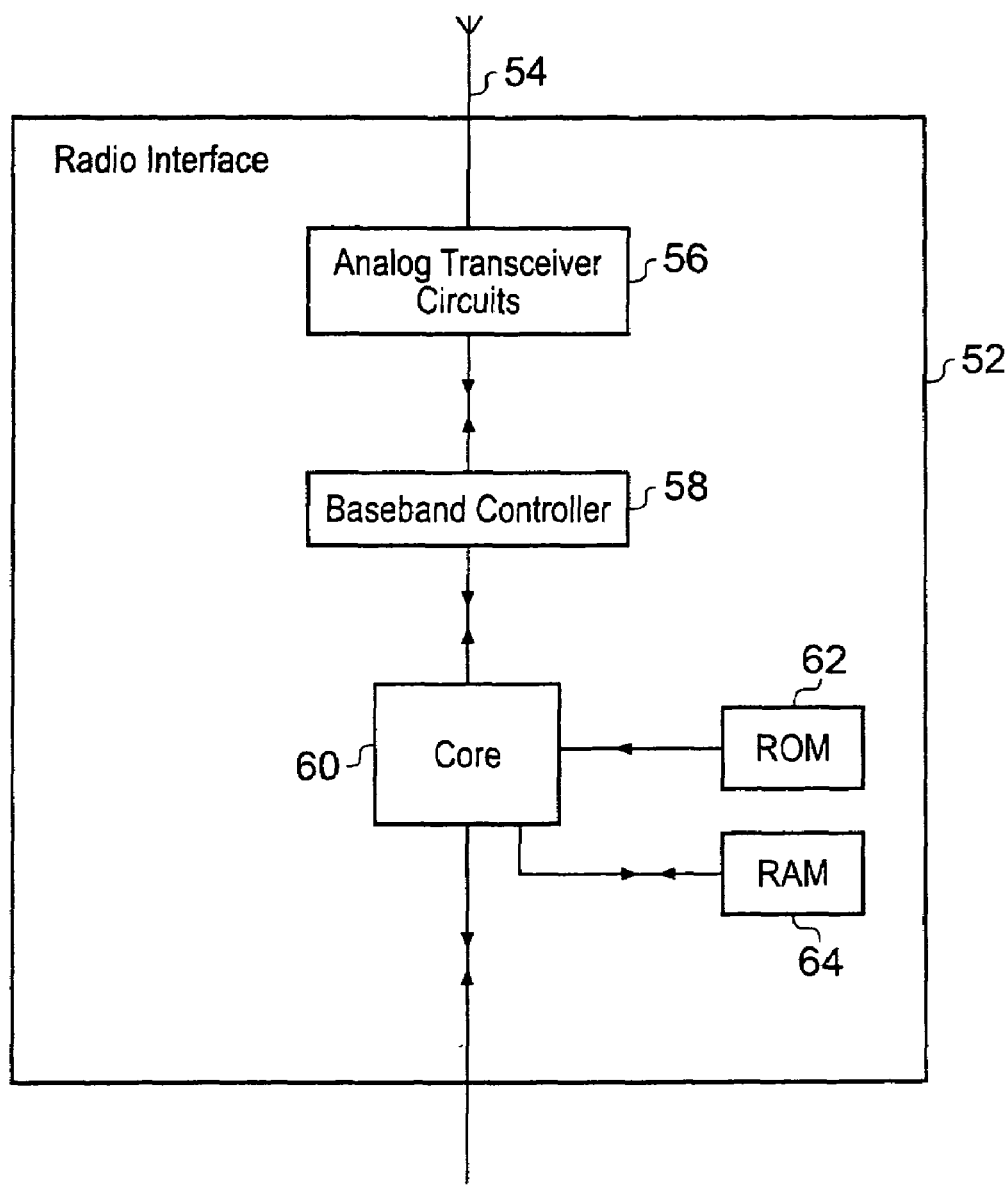
FIG. 4 schematically illustrates one example radio interface circuit having a dedicated processor core.

FIG. 4 illustrates an example radio interface circuit 52 in more detail. An antenna 54 is coupled to analog transceiver circuits 56 which is controlled by and communicates with a baseband controller circuit 58. The analog transceiver circuits and at least a portion of the baseband controller circuits 58, are analog circuits and serve to provide bi-directional radio communication using known radio interface techniques. A programmable processor core 60 is connected to the baseband controller 58 and under control of program instructions stored within either or both the memories 62, 64 serves to handle functions such as the communication stack and error correction/detection that may be employed as part of the radio communication. The radio interface circuit 52 may include its own dedicated programmable processor core 60 for these functions of the radio communication or alternatively it may reuse a processor core 4 provided for other operational non-diagnostic purposes within the integrated circuit. If such an operational core 4 is reused in this way, then appropriate program instructions are required to be available and triggered to be used when this functionality is required of the operational core 4.

Figure 5:
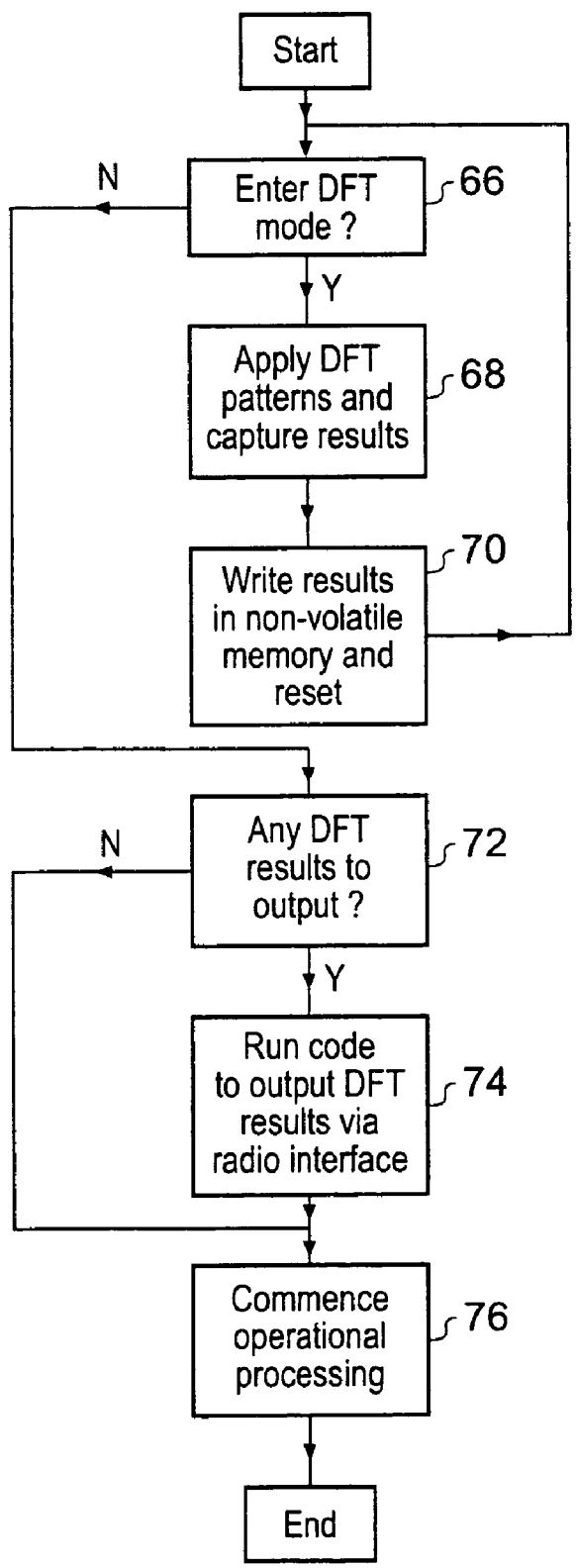
FIG. 5 is a flow diagram schematically illustrating control flow within an integrated circuit as part of its manufacturing test operation.

FIG. 5 is a flow diagram schematically illustrating one example process flow for manufacturing test. At step 66, the integrated circuit starts operation and a determination is made as to whether the integrated circuit should enter its manufacturing test mode. The integrated circuit may trigger manufacturing test mode to be entered upon every power on reset (as opposed to a soft reset) or alternatively upon the first ever reset of the integrated circuit (a type of golden boot). If manufacturing test mode is to be entered, then processing proceeds to step 68 at which the test patterns are applied to the different data processing circuits within the integrated circuit and the results captured therefrom. When the test patterns have completed, step 70 writes the results obtained into a non-volatile memory and resets the integrated circuit.

Processing returns from step 70 to step 66 at which a determination is made that the manufacturing tests need not be run and the integrated circuit passes to step 72. Step 72 checks to see if there are any manufacturing test results that have yet to be output from the integrated circuit. If such unreported manufacturing test results are present, such as may be indicated by an appropriate flag within the non-volatile memory written at step 70 and cleared on output of the results, then these results are output from the integrated circuit via the radio interface circuit at step 74. Following step 74, if this is executed, step 76 commences normal operation of non-diagnostic processing by the integrated circuit.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An integrated circuit comprising:
    at least one data processing circuit operable to perform data processing operations;
    a diagnostic circuit operable to perform one or more diagnostic operations upon said at least one data processing circuit; and
    a radio for providing communication between said diagnostic circuit and an external diagnostic device, wherein said radio, during non-diagnostic operations of said integrated circuit, provides communication between said data processing circuits and an external non-diagnostic device.

2. The integrated circuit as claimed in claim 1, wherein said diagnostic circuit is operable to generate diagnostic result data and said radio is operable to transmit said diagnostic result data to said external diagnostic device.

3. The integrated circuit as claimed in claim 1, wherein said diagnostic circuit is responsive to diagnostic control data and said radio is operable to receive said diagnostic control data from said external diagnostic device.

4. The integrated circuit as claimed in claim 1, wherein said diagnostic circuit is a debug circuit operable to perform debugging operations by control of one of said data processing circuits.

5. The integrated circuit as claimed in claim 1, wherein said diagnostic circuit is a tracing circuit operable to perform tracing operations upon said data processing circuits.

6. The integrated circuit as claimed in claim 5, wherein said radio provides real time communication with said external diagnostic device of trace data generated by said tracing circuit.

7. The integrated circuit as claimed in claim 1, wherein said diagnostic circuit is a manufacturing test circuit operable to perform manufacturing test operations upon said data processing circuits.

8. The integrated circuit as claimed in claim 7, wherein said radio is operable to transmit one or more results of said manufacturing test operations to said external diagnostic device.

9. The integrated circuit as claimed in claim 1, wherein one of more of said data processing circuits are used in combination with said radio to provide said communication between said diagnostic circuit and said external diagnostic device.

10. The integrated circuit as claimed in claim 1, wherein said data processing circuit include a program controlled processor core and said program controlled processor is operable to execute diagnostic communication program routines that serve with said radio to provide said communication between said diagnostic circuit and said external diagnostic device.

11. The integrated circuit as claimed in claim 1, wherein said radio is a Bluetooth on-chip radio circuit and diagnostic operation is provided by a diagnostic profile over a Bluetooth radio link.

12. A method of performing diagnostic operations upon an integrated circuit, said method comprising the steps of:
    performing one or more diagnostic operations with a diagnostic circuit upon one or more data processing circuits of said integrated circuit; and
    communicating between said diagnostic circuit and an external diagnostic device with a radio, wherein said radio, during non-diagnostic operations of said integrated circuit, provides communication between said data processing circuits and an external non-diagnostic device.

13. The method as claimed in claim 12, wherein said diagnostic circuit is operable to generate diagnostic result data and said radio is operable to transmit said diagnostic result data to said external diagnostic device.

14. The method as claimed in claim 12, wherein said diagnostic circuit is responsive to diagnostic control data and said radio is operable to receive said diagnostic control data from said external diagnostic device.

15. The method as claimed in claim 12, wherein said diagnostic circuit is a debug circuit operable to perform debugging operations by control of one of said data processing circuits.

16. The method as claimed in claim 12, wherein said diagnostic circuit is a tracing circuit operable to perform tracing operations upon said data processing circuits.

17. The method as claimed in claim 16, wherein said radio provides real time communication with said external diagnostic device of trace data generated by said tracing circuit.

18. The method as claimed in claim 12, wherein said diagnostic circuit is a manufacturing test circuit operable to perform manufacturing test operations upon said data processing circuits.

19. The method as claimed in claim 18, wherein said radio is operable to transmit one or more results of said manufacturing test operations to said external diagnostic device.

20. The method as claimed in claim 12, wherein one or more of said data processing circuits are used in combination with said radio to provide said communication between said diagnostic circuit and said external diagnostic device.

21. The method as claimed in claim 12, wherein said data processing circuit includes a program controlled processor core and said program controlled processor is operable to execute diagnostic communication program routines that serve with said radio to provide said communication between said diagnostic circuit and said external diagnostic device.

22. The method as claimed in claim 12, wherein said radio is a Bluetooth on-chip radio circuit and diagnostic operation is provided by a diagnostic profile over a Bluetooth radio link.

* * * * *